Figure 1A:
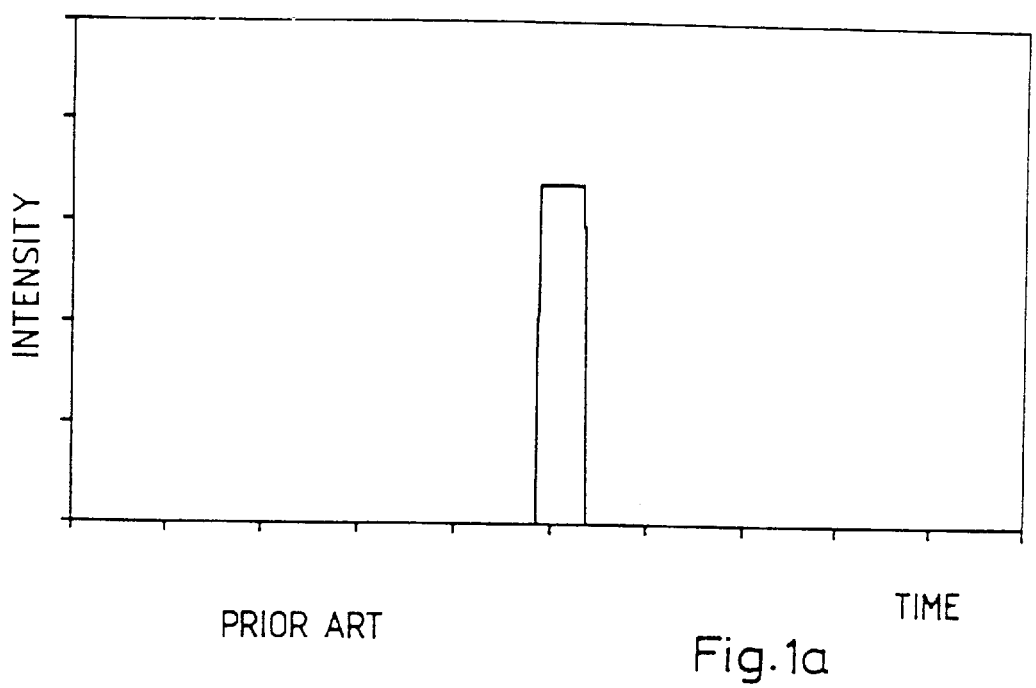

United States Patent [19]
Smith et al.

[11] Patent Number: 5,814,987
[45] Date of Patent: Sep. 29, 1998

[54] APPARATUS FOR AND METHOD OF NUCLEAR RESONANCE TESTING

[75] Inventors: John Alec Sydney Smith, London; Martin Blanz, Culham, both of United Kingdom

[73] Assignee: British Technology Group Limited, London, England

[21] Appl. No.: 619,466

[22] PCT Filed: Sep. 23, 1994

[86] PCT No.: PCT/GB94/02070

§ 371 Date: Mar. 25, 1996

§ 102(e) Date: Mar. 25, 1996

[87] PCT Pub. No.: WO95/09368

PCT Pub. Date: Apr. 6, 1995

[30] Foreign Application Priority Data

Sep. 27, 1993 [GB] United Kingdom .................. 9319875

[51] Int. Cl.⁶ ............................................. G01V 3/00
[52] U.S. Cl. ............................................. 324/300; 324/301
[58] Field of Search ................................... 324/300, 301, 324/304, 307, 309, 312, 314

[56] References Cited

U.S. PATENT DOCUMENTS

| | | | |
|---|---|---|---|
| 3,643,181 | 2/1972 | Stirrat et al. ............................ | 324/300 |
| 3,768,003 | 10/1973 | Amen . | |
| 3,968,424 | 7/1976 | Ernst . | |
| 4,034,191 | 7/1977 | Tomlinson et al. . | |
| 4,703,267 | 10/1987 | Maudsley . | |
| 4,766,380 | 8/1988 | Den Boef et al. . | |
| 4,906,932 | 3/1990 | Ordidge . | |
| 5,153,515 | 10/1992 | Leigh et al. . | |
| 5,233,300 | 8/1993 | Buess et al. ............................ | 324/300 |
| 5,365,171 | 11/1994 | Buess et al. ............................ | 324/300 |
| 5,500,591 | 3/1996 | Smith et al. ............................ | 324/307 |
| 5,583,437 | 12/1996 | Smith et al. ............................ | 324/307 |

FOREIGN PATENT DOCUMENTS

| | | |
|---|---|---|
| 209 374 | 1/1987 | European Pat. Off. . |
| 242 911 | 10/1987 | European Pat. Off. . |
| 394 504 | 10/1990 | European Pat. Off. . |
| 601 229 | 6/1994 | European Pat. Off. . |
| 1 357 686 | 6/1974 | United Kingdom . |
| 1 448 939 | 9/1976 | United Kingdom . |
| 2 206 970 | 1/1989 | United Kingdom . |
| 2 208 442 | 3/1989 | United Kingdom . |
| 2 254 923 | 10/1992 | United Kingdom . |
| 2 255 414 | 11/1992 | United Kingdom . |
| 2 255 830 | 11/1992 | United Kingdom . |
| 91 15754 | 10/1991 | WIPO . |
| 92 17794 | 10/1992 | WIPO . |
| 92 21989 | 10/1992 | WIPO . |
| WO93/02365 | 2/1993 | WIPO . |

OTHER PUBLICATIONS

Guan: "Generation of optimal excitation pulses for two energy level systems using an inverse Fourier transform method", The Journal of Chemical Physics, vol. 96, No. 11, Jun. 1, 1992, pp. 7959–7964.

Goelman, et al: "Multiband Adiabatic Inversion Pulses", Journal of Magnetic Resonance, vol. 101A, No. 2, Feb.1, 1993, pp. 136–146.

(List continued on next page.)

*Primary Examiner*—Louis M. Arana
*Attorney, Agent, or Firm*—Cushman Darby & Cushman, IP Group of Pillsbury Madison & Sutro LLP

[57] ABSTRACT

Apparatus for Nuclear Quadrupole Resonance testing a sample comprises: means for applying excitation to the sample to excite NQR resonance, the excitation comprising at least one excitation pulse, the or each pulse covering a selected excitation frequency range, for the or each pulse the phase of the excitation varying generally non-linearly with the excitation frequency over the selected range; and means for detecting the NQR response signal.

27 Claims, 13 Drawing Sheets

OTHER PUBLICATIONS

Ngo, et al: "Gerneral Solution to the NMR Excitation Problem for Noninteracting Spins", Magnetic Resonance in Medicine 5, 217–237 (1987).

Tzannes,: "Communication and Radar Systems", 1985.

Guan: "General phase modulation method for stored waveform inverse Fourier transform excitation for Fourier transform ion cyclotron resonance mass spectrometry", Journal of Chem.Phys. vol. 91, No. 2, Jul. 15m 1989, pp. 775–776 (Also see Appln. p. 3).

Marshall et al: "Fourier Transforms in NMR, Optical and Mass Spectrometry", 1990, pp. 107–109 (Also see Appln. p. 3).

Wittebort, et al: "High–Speed Phase and Amplitude Modulator", Journal of Magnetic Resonance, vol. 96. 624–630 (1992).

APPARATUS FOR AND METHOD OF NUCLEAR RESONANCE TESTING

This application claims benefit of International application PCT/GB94/02070, filed Sep. 23, 1994.

This invention relates to apparatus for and a method of Nuclear Resonance testing a sample. Such testing may be Nuclear Magnetic Resonance (NMR) or Nuclear Quadrupole Resonance (NQR) testing.

In particular, the invention relates to NQR testing for the presence in a sample of certain substances which exhibit NQR effects. Such substances include drugs such as heroin and cocaine, and explosives such as TNT, RDX, HMX and PETN. Typically, the apparatus and method might be employed to test for the presence of such substances in airport luggage.

Methods of NQR testing for the presence of certain substances are known from, for example, United Kingdom Patent Applications Nos. GB-2254923, GB-2255414 and GB-2255830 (all of which are in the name of British Technology Group Ltd.). Such methods include the steps of applying excitation to the sample to excite NQR resonance, and detecting the NQR resonance response signal. Since the substances of interest (such as heroin, cocaine, TNT, RDX, HMX and PETN) have well characterised and distinct resonance response characteristics, the NQR resonance response signal can be analysed to yield information as to whether or not a particular substance is present in a sample. If the substance is determined to be present, an alarm may be sounded.

In the known techniques, the excitation takes the form of pulses of radio-frequency irradiation. In the time domain the waveform of these pulses is rectangular. Such rectangular pulses appear in the frequency domain as a spectrum having a sharp central peak and side bands which decrease in amplitude away from the central peak. It will be appreciated that the frequency domain bandwidth of a rectangular pulse is inversely related to its time domain duration (or width), so that the shorter the pulse, the greater the bandwidth. Since the exact NQR frequency is dependent on the temperature of the sample, for testing for the presence of the various substances of interest when the sample temperature is not exactly known, a large bandwidth is required (typically 20 kHz). This requires a short pulse (say 30 $\mu$s). In order to excite the substance sufficiently for detectable response signals to be derived, the peak radio-frequency power of the pulse may need to be, for example, 2 kW or more, depending on the volume of the probe. Such a level of peak power may be undesirably high.

The present invention seeks to provide apparatus and a method of NQR testing which can afford similar performance to that afforded in the known techniques, but using a lower peak radio-frequency power and preferably avoiding the use of rectangular pulses.

Further prior art of relevance is described in U.S. Pat. No. 5,153,515, WO-A-92/21989, Magn.Res.Med 5 (1987) 217–237, EP-A-O 394 504 and EP-A-O 242 911. None of these documents describe Nuclear Quadrupole Resonance techniques.

According to the present invention, there is provided apparatus for Nuclear Quadrupole Resonance (NQR) testing a sample, comprising:
means for applying excitation to the sample;
means for detecting the response signal; and
control means adapted to control the excitation applying means to apply excitation to the sample to excite NQR resonance, the excitation comprising at least one excitation pulse, the or each excitation pulse covering a selected excitation frequency range, the phase of the or each excitation pulse varying generally non-linearly with the excitation frequency over the selected range, the control means further being adapted to control the a detecting means to detect the NQR response signal.

Suitably, the excitation is pulsed excitation at a carrier frequency $v_0$ and the phase of the excitation varies generally non-linearly with the frequency off-set ($\Delta v = v - v_0$).

This invention arises from the surprising discovery in the field of Nuclear Quadruple Resonance, made pursuant to the present invention, that by applying excitation whose phase varies non-linearly with the excitation frequency, the peak power of the excitation can be reduced very significantly. In one example, peak power has been reduced by more than an order of magnitude. A very significant reduction in peak radio-frequency magnetic field has also been achieved.

It is known from a paper entitled "Generation of optimal excitation pulses for two energy level systems using an inverse Fourier transform method" by Guan, S. (J. Chem. Phys., Vol. 96, No. 11, 1992, pp. 7959ff.) to use excitation, the phase of which varies non-linearly with the excitation frequency, in the different technical field of Nuclear Magnetic Resonance (NMR). Such excitation is employed to solve a different problem, namely that of NMR Solvent suppression. The excitation yields a notched spectrum in the frequency domain. The above paper follows on from an earlier paper by Guan, S. entitled "General phase modulation method for stored waveform inverse Fourier transform excitation for Fourier transform ion cyclotron mass spectrometry", J. Chem. Phys., Vol. 91, No. 2, 1989, pp. 775ff. (see also Section 4.2.3 of the book entitled "Fourier Transforms in NMR, Optical, and Mass Spectrometry, A Users' Handbook", by Marshall, A. G. and Verdun, F. R., published by Elsevier, 1990).

However, the technique proposed by Guan for using such excitation in NMR testing would not be expected to be applicable to NQR testing, because it relies on an assumption that the substance being tested is a two-level system which follows the Bloch equations. The Bloch equations, it should be noted, are applicable to NMR in liquids, ion-cyclotron resonance, FT mass spectroscopy and electronic laser spectroscopy. However, they are not applicable to substances which exhibit NQR effects. Hence Guan's technique would not be expected to work in NQR. In fact, it is surprising that, and not fully understood why, the technique does actually work in NQR.

It is also to be noted that Guan's technique is deliberately limited to the time domain waveform of the excitation being only amplitude modulated, but not also otherwise phase modulated. (It will be understood that amplitude modulation by itself, when the amplitude varies between positive and negative values, involves modulation of the phase, say between 0 and 180 degrees.)

Preferably, for the duration of the excitation an envelope of the time domain excitation waveform has no zero crossings. This can have the advantage of reducing the peak power (and radio-frequency magnetic field) of the excitation considerably.

In one preferred embodiment, the excitation applying means is adapted to apply excitation the time domain waveform of which is both amplitude and phase modulated. As opposed to the case where the waveform is only amplitude modulated, this arrangement can be utilised to produce an excitation waveform whose envelope has no zero crossings.

In this embodiment, preferably the applying means includes means for producing two signals which are in relative quadrature, and means for combining the signals to form the amplitude and phase modulated excitation. Again, preferably the signal producing means includes means for generating a signal and for splitting the signal into two signals in relative quadrature. These two features can yield a simple way of putting the invention into practice.

It is to be noted that these features are known per se from a paper entitled "High-Speed Phase and Amplitude Modulator", by Wittebort, R. J. et al. (J. Magn. Reson., Vol. 96, 1992, pp. 624ff.). The modulator described in this paper is designed to be operated at a carrier frequency of 30 MHz, far above the frequency range of, say, 0.5 to 6 or 8 MHz likely to be of interest in $^{14}$N NQR testing.

Two types of signal may be generated for subsequent splitting. The generating means may be adapted to generate a carrier signal at a fixed amplitude. Alternatively or additionally, the generating means may be adapted to generate a signal having a varying amplitude.

In an alternative preferred embodiment, the applying means is preferably adapted to apply excitation the time domain waveform of which is amplitude modulated but not otherwise phase modulated. This embodiment may not permit such low peak excitation powers to be achieved as are achievable with other embodiments, but can be simpler to manufacture since there is no requirement to modulate the phase directly.

In a further preferred embodiment, the applying means is adapted to apply excitation the time domain waveform of which is modulated according to a chirp function. This is a particularly simple way of putting the invention into practice, since a chirp function is easy to implement. The chirp function may, for example, be a linear chirp function of the form $\cos(\omega t^2)$; that is, the modulation is pure phase modulation, the phase being modulated linearly with respect to the frequency off-set.

In any embodiment, preferably the excitation applying means includes means for generating a carrier signal and means for modulating the carrier signal to produce excitation the phase of which varies generally non-linearly with the excitation frequency over the selected excitation frequency range. This can be a particularly convenient way of putting the invention into practice. The modulating means suitably includes means for storing a representation of a modulating waveform for modulating the carrier signal.

The variation of the phase of the excitation with the excitation frequency may, for example, be symmetric or antisymmetric with respect to the carrier frequency $v_0$. In either event, the phase variation is preferably quadratic (that is, proportional to $(v-v_0)^2$); this has been found to give rise to low peak excitation powers. Another possibility is to vary the phase with statistical noise, but this can result in a noisy spectrum; a further disadvantage may be that the time domain waveform has many zero crossings, so that time is not used efficiently.

If the phase variation is quadratic, then in one particularly preferred embodiment a plurality of excitation pulses are applied, in such a way as to generate at least one echo response signal. It may be advantageous to generate echo response signals, as opposed to free induction decay signals, especially in circumstances in which the spin-lattice relaxation time, $T_1$, of the substance being tested is relatively long.

This feature arises from the surprising discovery, made pursuant to the present invention, that shaped pulses in which the phase variation is quadratic preserve the phase of the NQR response signal. Such phase preservation is necessary for the successful generation of echoes.

Preferably, the modulus of the frequency domain excitation spectrum is substantially constant over the selected excitation frequency range. Thus the excitation can be uniform over the frequency range.

This invention extends to a method of Nuclear Quadrupole Resonance (NQR) testing a sample comprising:

applying excitation to the sample to excite NQR resonance, the excitation comprising at least one excitation pulse, the or each excitation pulse covering a selected excitation frequency range, the phase of the or each excitation pulse varying generally non-linearly with the excitation frequency over the selected range; and detecting the NQR response signal.

A selected NQR resonance may be excited, and, if so, the duration of the excitation is preferably less than twice the free induction decay time, $T_2^*$, appropriate to that resonance. This is an important feature, which can ensure that unacceptable loss of the NQR response signal does not arise before the signal is detected. The duration is in fact preferably less than 100%, 75% or even 50% of $T_2^*$.

In a closely related aspect of the invention, there is preferably provided apparatus for Nuclear Resonance testing a sample, comprising means for applying excitation to the sample over a selected excitation frequency range to excite nuclear resonance, and means for detecting the response signal, the applying means being adapted to apply excitation the time domain waveform of which is both amplitude and phase modulated.

In another closely related aspect, there is preferably provided apparatus for Nuclear Quadrupole Resonance testing a sample, comprising means for applying excitation to the sample over a selected excitation frequency range to excite NQR resonance, and means for detecting the NQR response signal, the phase of the excitation varying generally non-linearly with the excitation frequency over the selected range.

Analogous methods are also provided.

All the aforementioned features apply to these preferred aspects of the invention.

In a further closely related aspect, the invention provides a method of extending the Nuclear Quadrupole Resonance (NQR) free induction decay time, $T_2^*$, of a sample containing quadrupolar nuclei, comprising applying excitation to the sample over a selected excitation frequency range to excite NQR resonance, the phase of the excitation varying generally non-linearly with the excitation frequency over the selected range.

This aspect of the invention stems from the discovery pursuant to the present invention that if a nuclear signal is excited with a varying phase the length of the free induction decay may be greater compared with the case of simple excitation with constant phase. The reasons for this appear to be analogous to the reasons given below why the applied excitation itself is longer in such circumstances.

For a significant change in the f.i.d. time, $T_2^*$, to be observed, the applied excitation should have considerable phase variation within the bandwidth of the nuclear signal. Hence an appropriate test of the technique is a broad nuclear resonance line such as the 3460 kHz NQR line of RDX with a bandwidth of 1 kHz.

The technique of this aspect of the present invention can be particularly useful, for example, when $T_2^*$ is less than $T_2$, to obviate dead time problems due to probe ring down, or in circumstances where only small r.f. amplitudes and therefore small flip angles can be used.

Method features analogous to the various apparatus features of any aspect of the invention may also be provided, and vice versa.

Figure 1B:
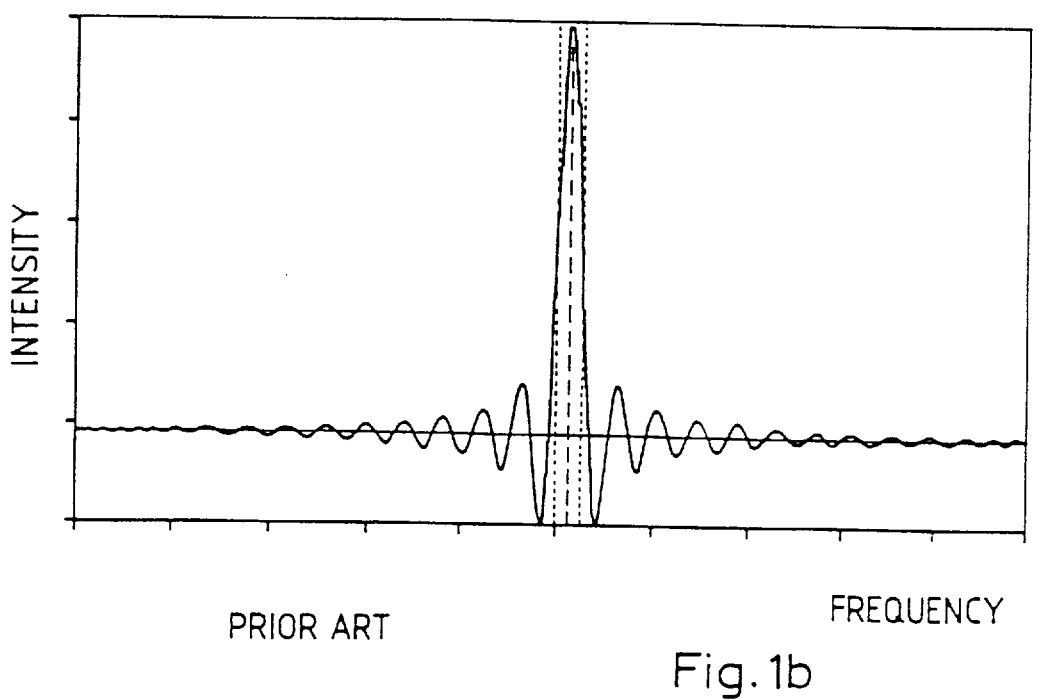
Figure 2:
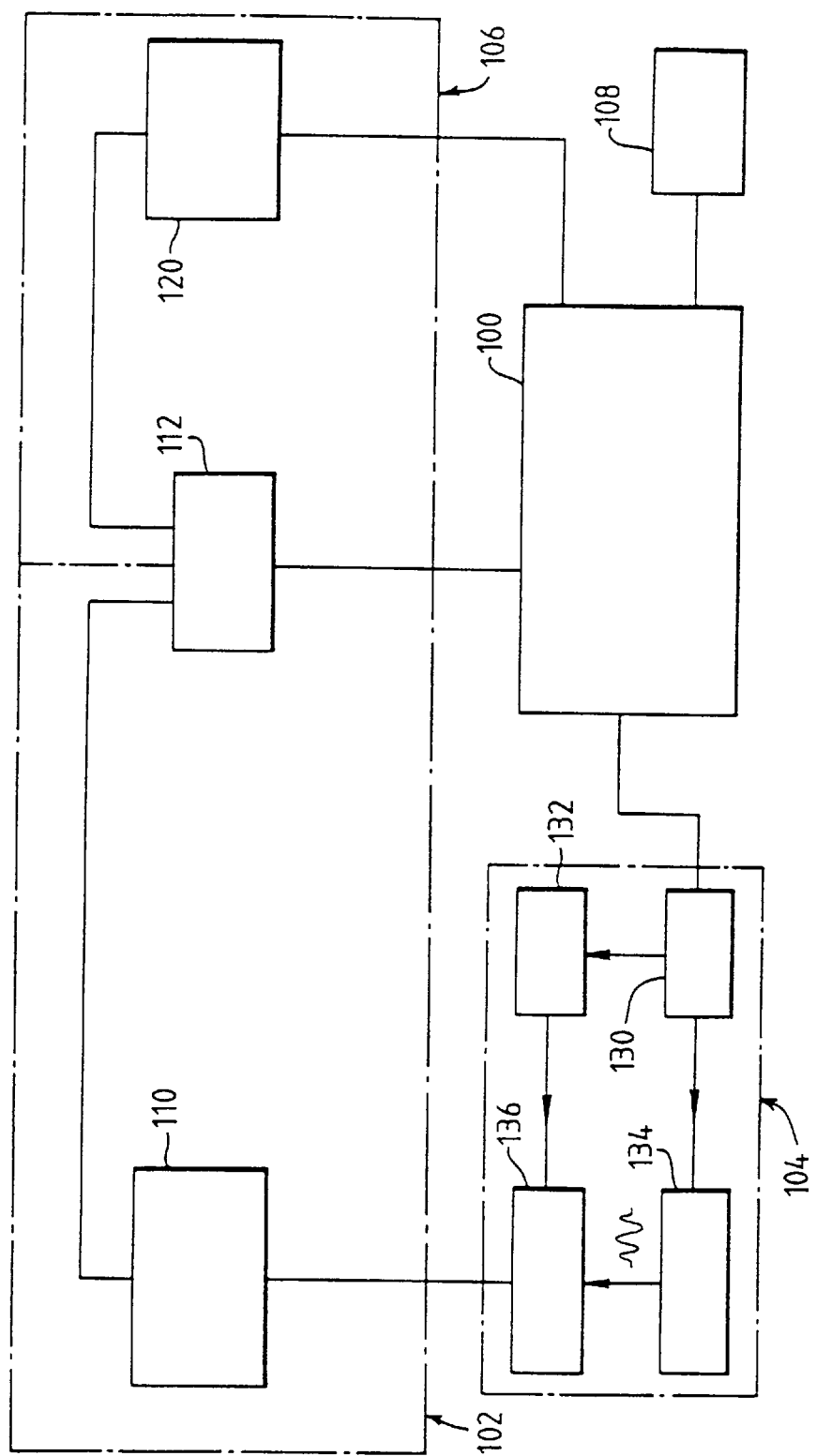
Figure 3A:
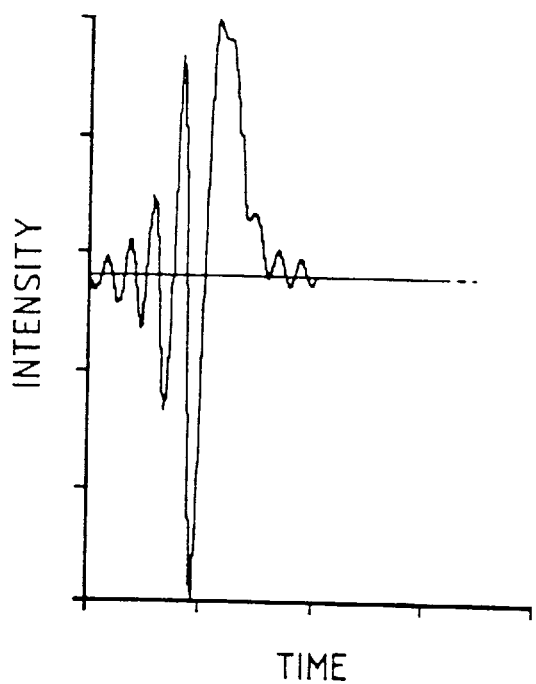
Figure 3B:
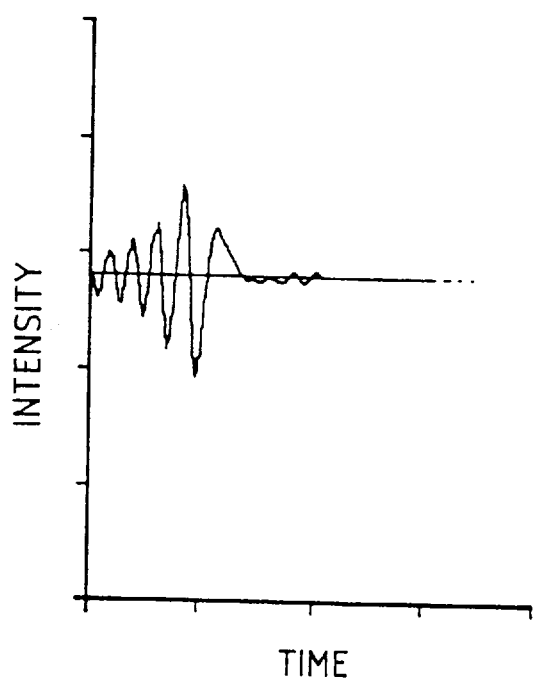
Figure 3C:
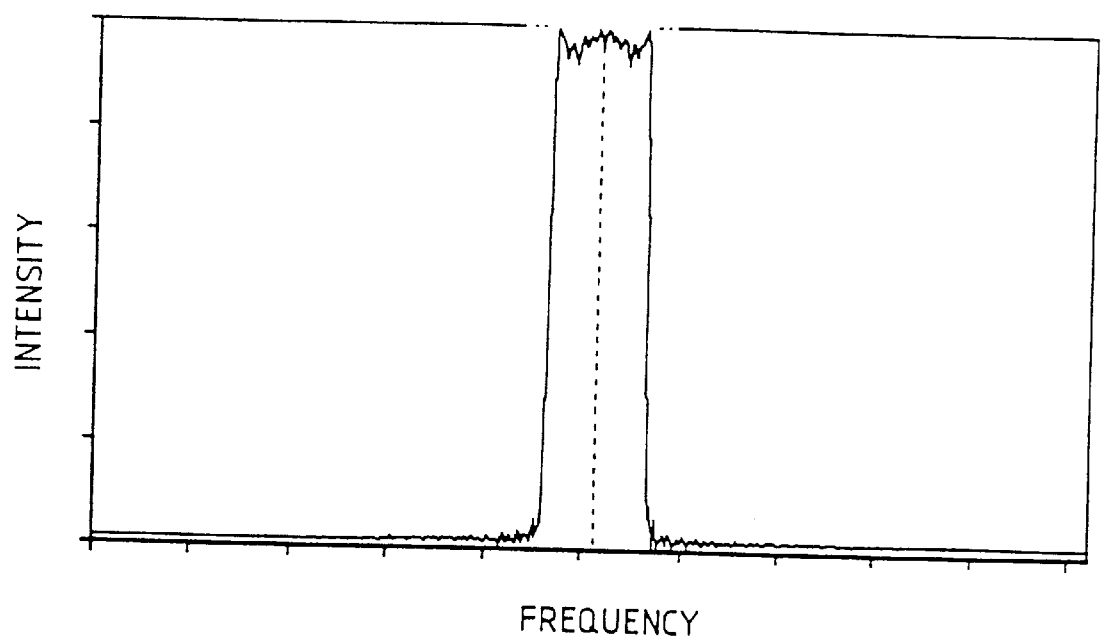
Figure 3D:
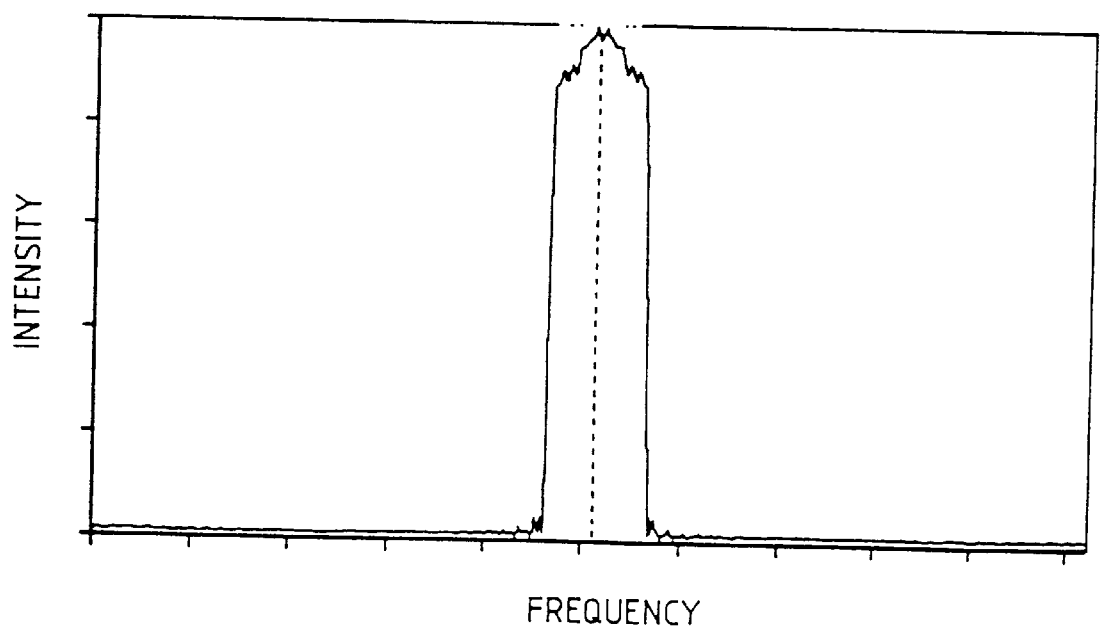
Figure 3E:
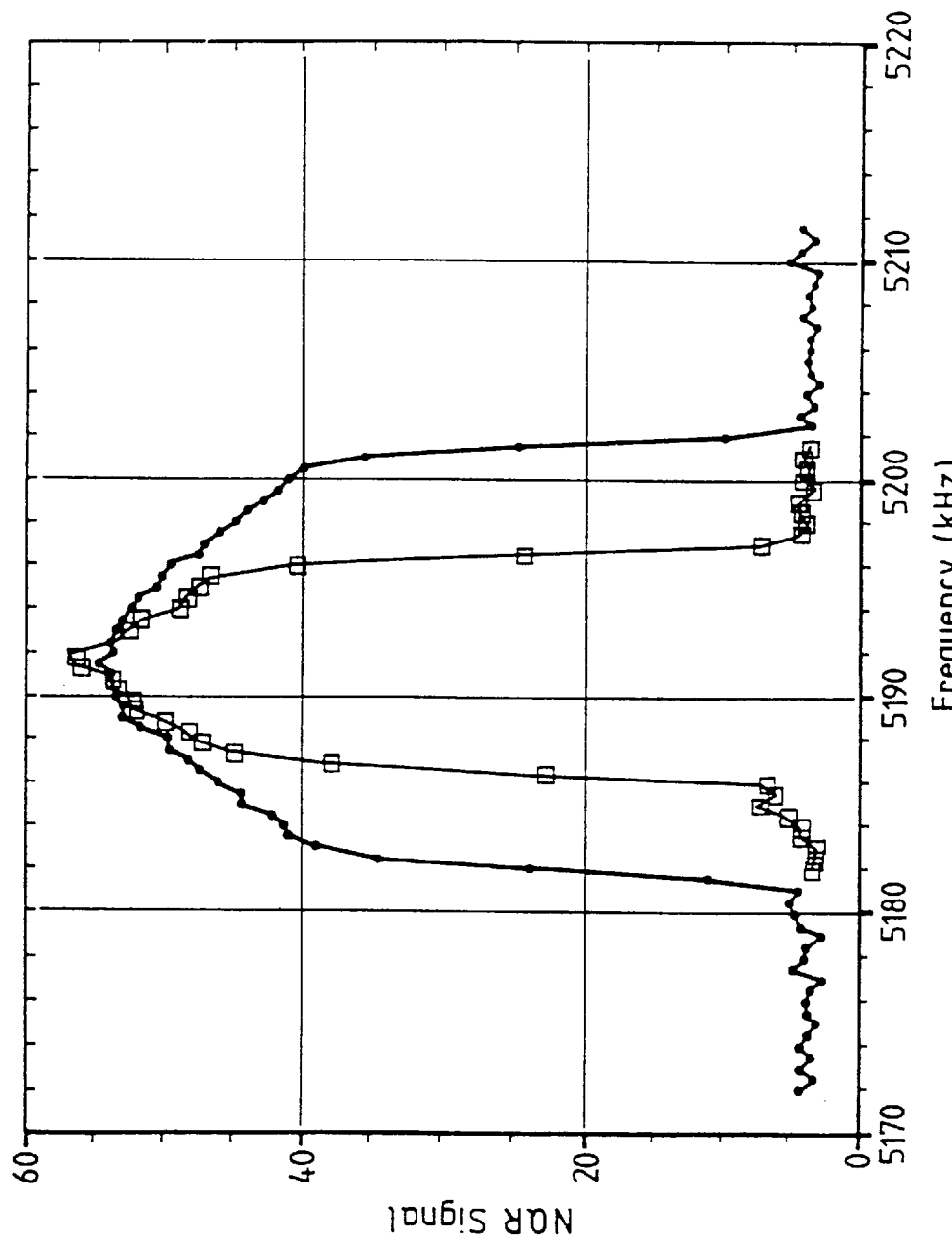
Figure 4A:
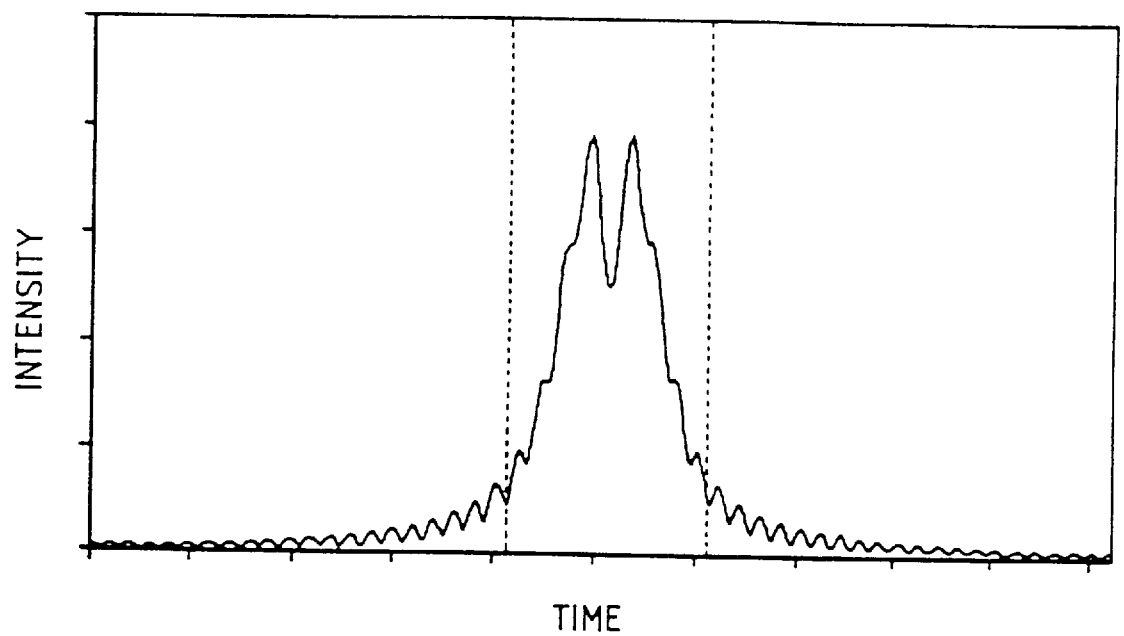
Figure 4B:
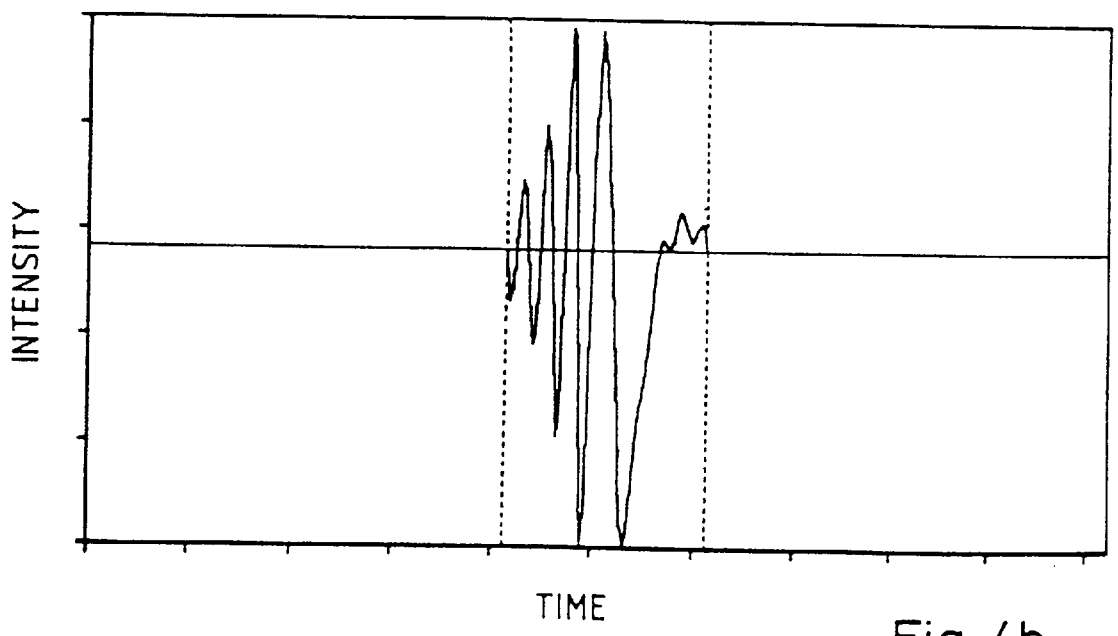
Figure 4C:
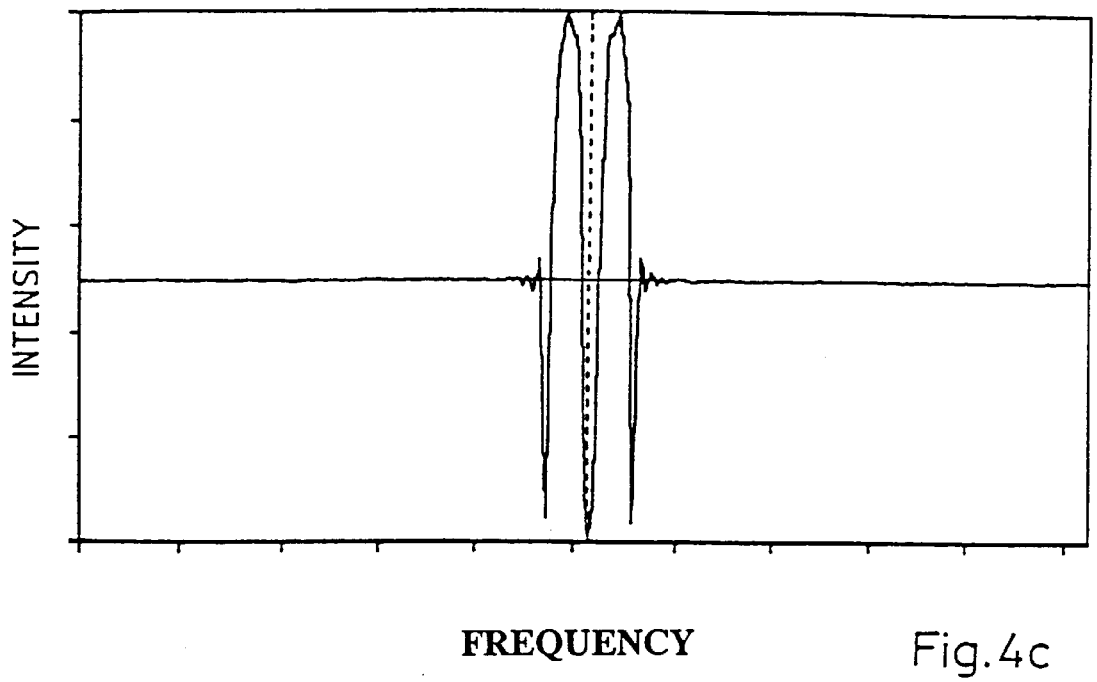
Figure 4D:
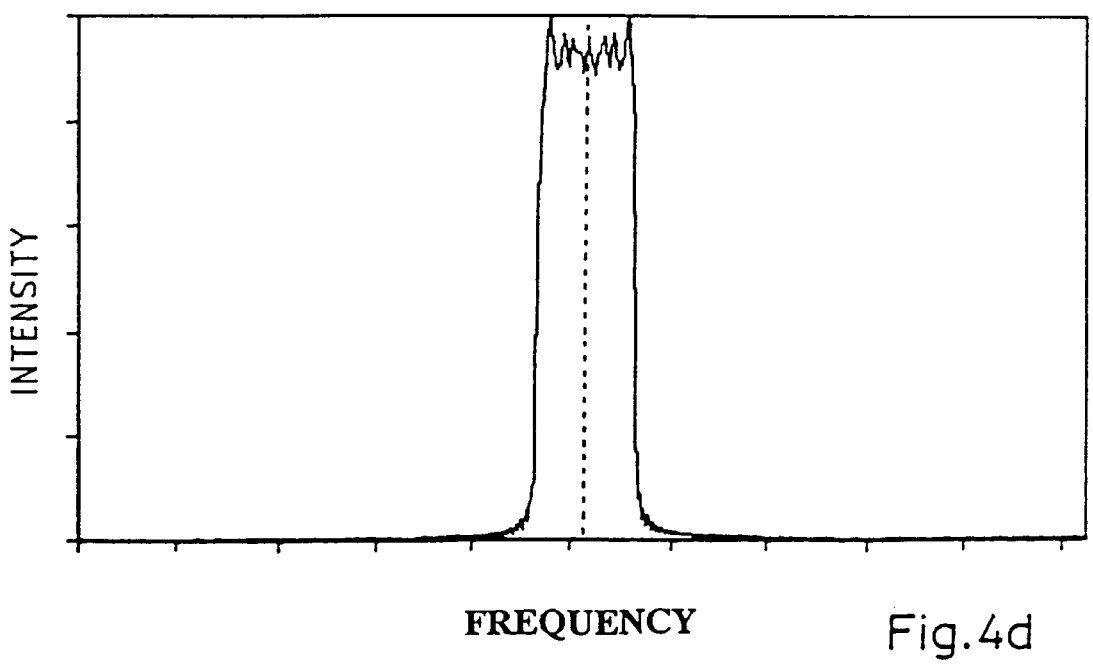
Figure 4E:
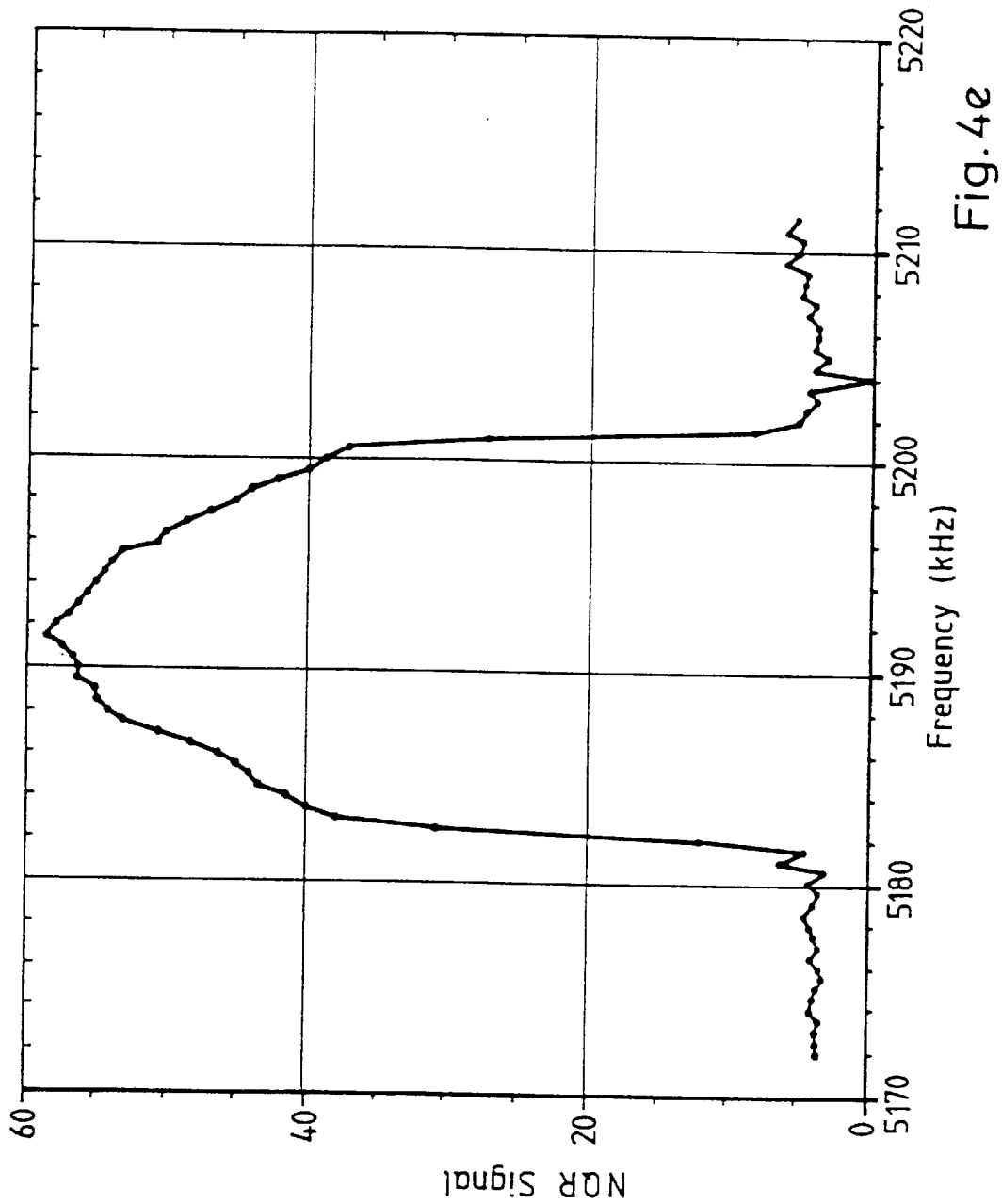
Figure 4F:
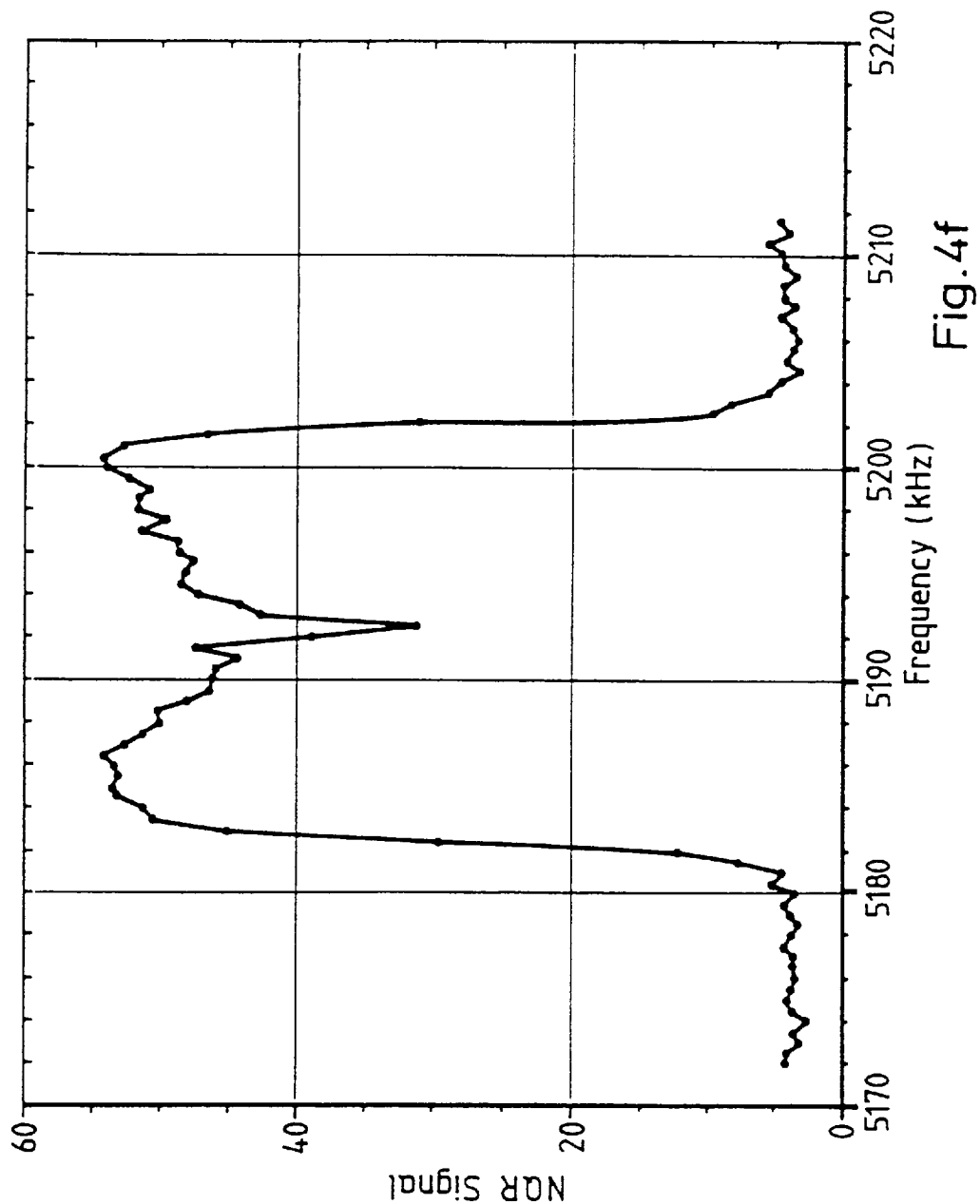
Figure 5:
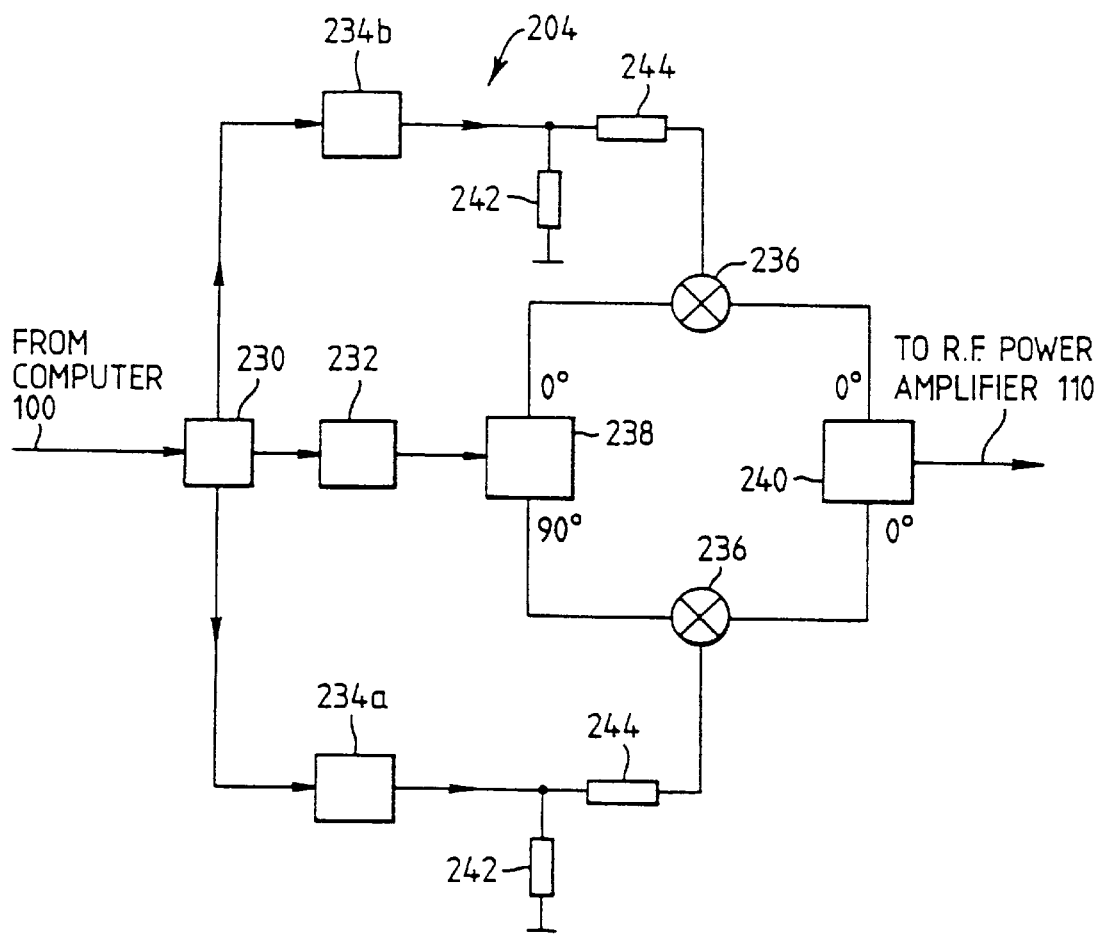
Figure 6A:
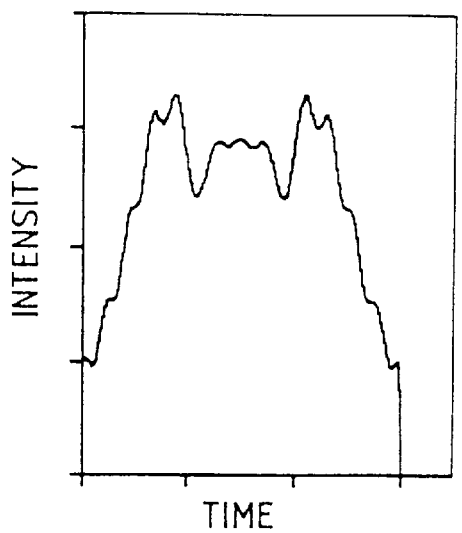
Figure 6B:
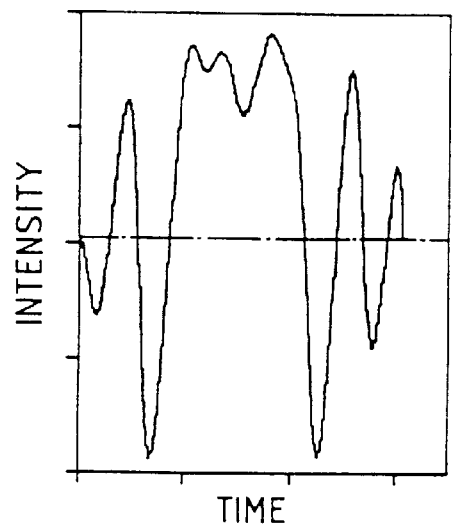
Figure 6C:
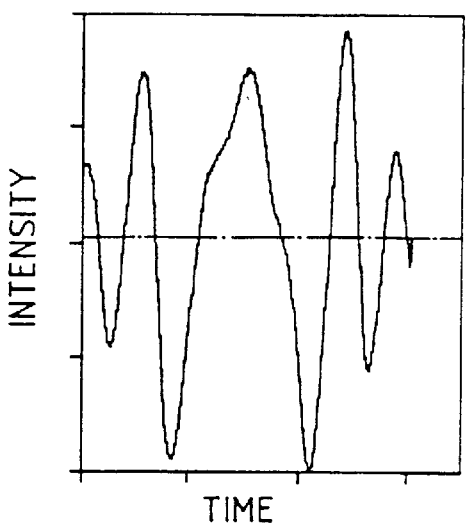
Figure 6D:
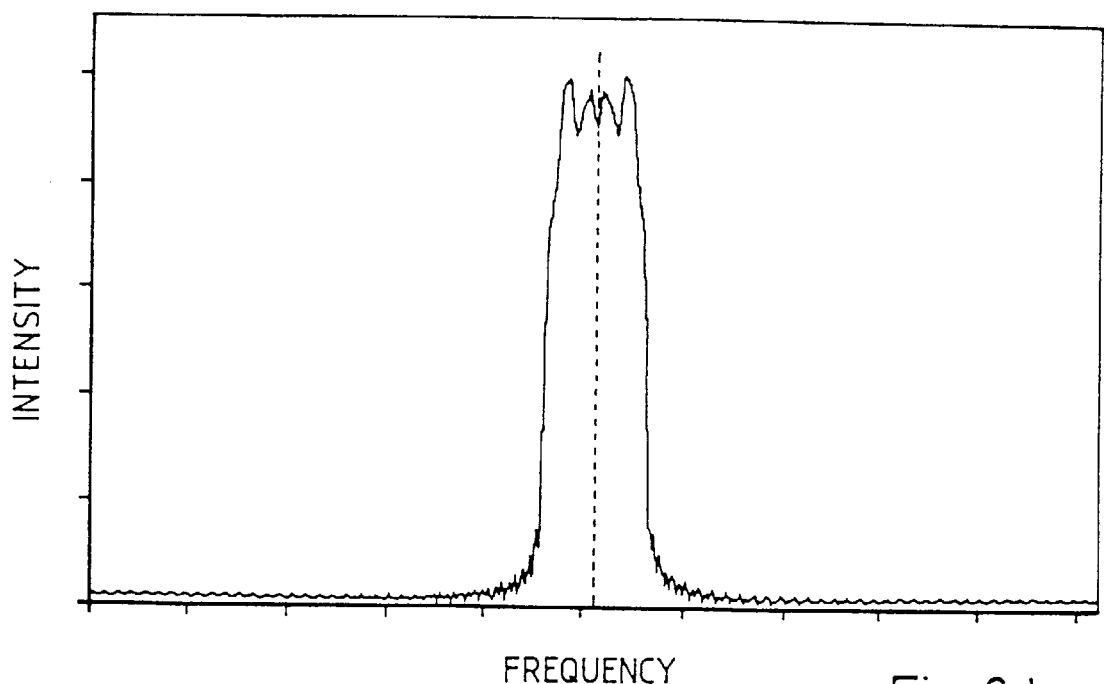
Figure 6E:
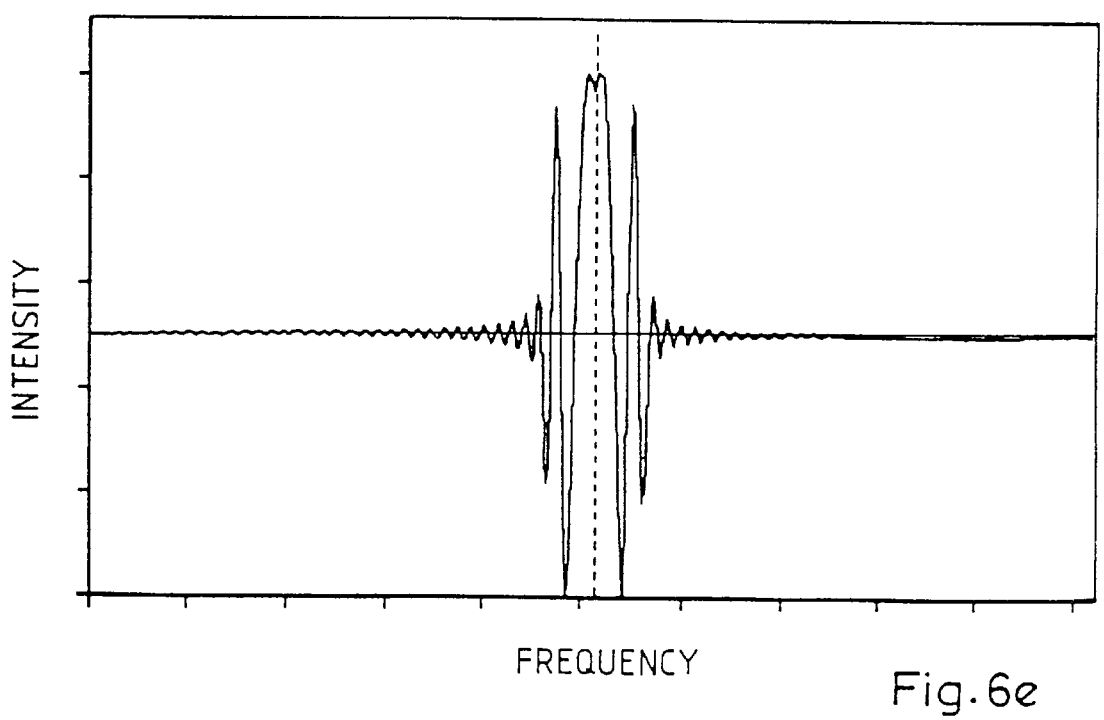
Figure 6F:
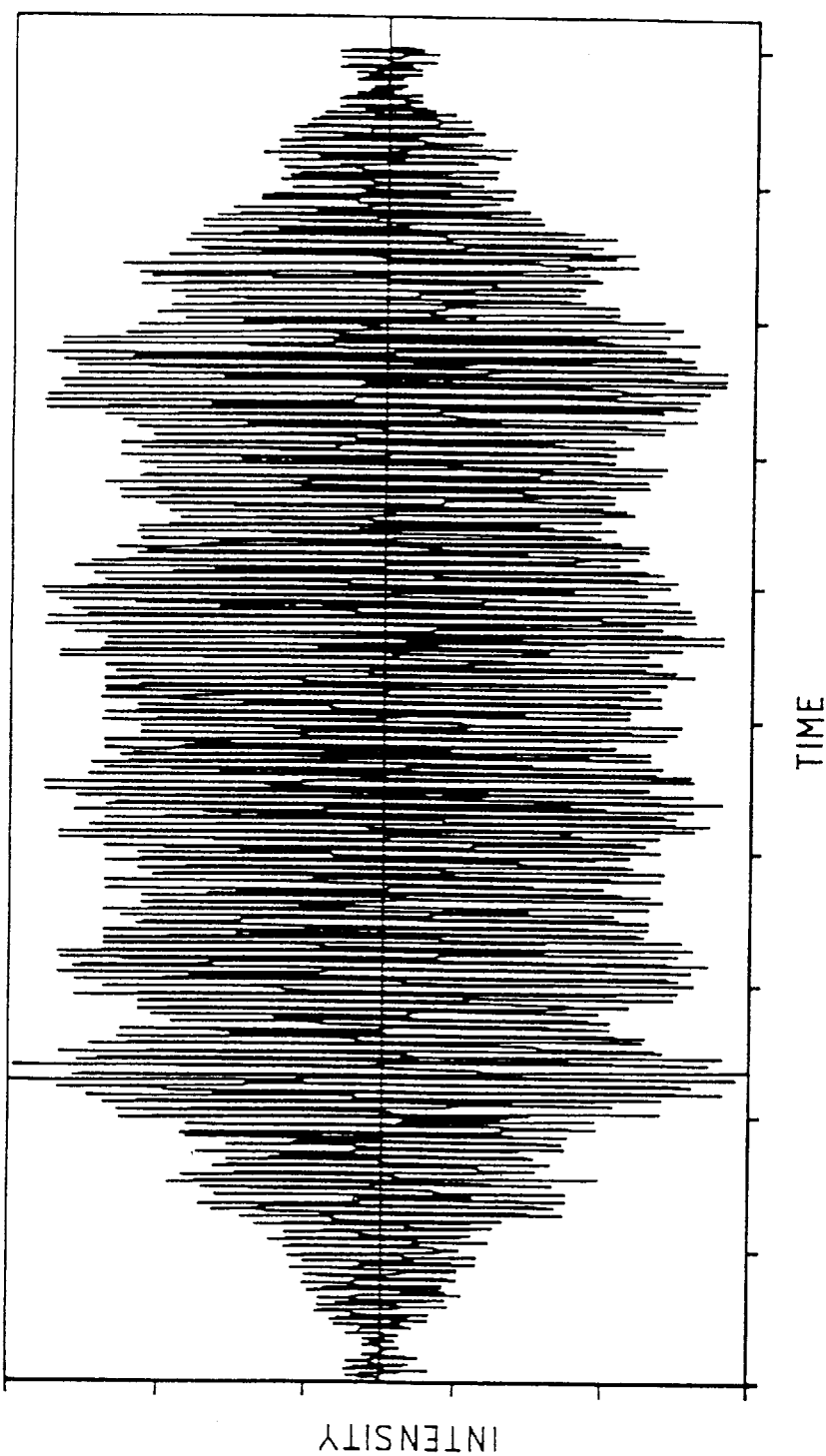

The theory underlying the present invention, as well as preferred features of the present invention, are now described, by way of example only, with reference to the accompanying drawings, in which:

FIGS. 1(a)–(b) (prior art) show a time domain rectangular excitation pulse (FIG. 1(a)) and its frequency domain equivalent (FIG. 1(b));

FIG. 2 is a block diagram of a preferred embodiment of NQR testing apparatus according to the present invention;

FIGS. 3(a) to 3(e) illustrate a first example of NQR test;

FIGS. 4(a) to 4(f) illustrate a second example of NQR test;

FIG. 5 is a block diagram of a variant of the preferred embodiment of NQR testing apparatus; and FIGS. 6(a) to 6(f) illustrate a third example of NQR test.

The basic theory underlying the present invention is first described. Referring to FIGS. 1, which show the known rectangular excitation pulse, this pulse appears in the time domain as the waveform in FIG. 1(a), and is equivalent, in the frequency domain, to the spectrum shown in FIG. 1(b). The spectrum of FIG. 1(b) includes a sharp central peak and sidebands which diminish in magnitude away from the central peak. It will be appreciated that the spectrum in FIG. 1(b) is the Fourier transform of the waveform in FIG. 1(a); this latter waveform is the inverse Fourier transform of this spectrum. It will also be appreciated that FIG. 1(a) actually shows only the envelope of the pulse (or, more precisely still, one half of the envelope of the pulse), in that the pulse comprises many radio-frequency oscillations.

It can be shown that, for a rectangular pulse of duration T, half-height bandwidth $\Delta v$ and peak pulse power P, T equals $0.6/\Delta v$ and P is proportional to $1/T^2$, provided that (in NQR) the product $B_{rf}T$, and therefore the flip angle, remains constant. $B_{rf}$ is defined as the amplitude of the oscillating radio frequency field. Hence the known rectangular pulse has the drawback that peak power increases strongly (quadratically, in fact) as bandwidth increases.

It appears from an analysis of the rectangular pulse that the high power requirement is attributable to two main factors. Firstly, the sidelobes apparent in the frequency domain consume substantial power without contributing to the useful part of the spectrum (the central peak). Secondly, the range of excitation frequencies contained in the pulse are in phase at time zero. Hence there is a high coherency between the various frequencies at and very close to time-zero, but destructive interference at other times. Thus the pulse is of short duration and high peak power.

In NQR, it has now been found that a solution to the first of these problems is to use a pulse which is shaped so as to yield a near-rectangular shaped frequency spectrum (that is, the modulus of the frequency domain excitation is substantially constant over the selected excitation frequency range). Shaping of the pulse is achieved by inverse Fourier transform of the near-rectangular frequency spectrum to yield the required shape of the time-domain excitation waveform.

The solution to the second of these problems (high coherency near time zero), it has now been found, is to use excitation the phase of which varies generally non-linearly with the frequency, so that the phases in the time domain are scrambled. Hence there is constructive interference between the various frequencies over a significantly longer duration than is the case for the simple rectangular pulse and at the same time less constructive interference at time zero. Thus the excitation pulse can be of longer duration and lower power. In fact, for a quadratic phase variation it has been found that at constant flip angle, the power P for such a pulse is more nearly proportional to $\Delta v$ than $\Delta v^2$ as is the case for the rectangular excitation pulse. This conclusion follows from the relationship $P \propto \Delta v/t_p$ or $B_{rf} \propto (\Delta v/t_p)^{1/2}$ where $t_p$ is the pulse length; $\Delta v$ and $t_p$ are not dependent (they are for the simple rectangular pulse), so keeping $t_p$ constant we get $B_{rf} \propto (\Delta v)^{1/2}$ and $P \propto \Delta v$. Power has also been found to be inversely proportional to the duration of the pulse for a given excitation bandwidth $\Delta v$. The duration is in practice only limited by the duration of the free induction decay time $T_2^*$ of the particular substance in question. This is discussed in more detail later.

The variation of phase with frequency should be non-linear in order to ensure a proper scrambling of the phases. A linear phase variation merely has the effect of producing a time-shift, but does not have the effect of scrambling phases. It has been found, in fact, that for NQR testing a quadratic phase variation may be optimal.

A preferred embodiment of NQR testing apparatus is now described with reference to FIG. 2. This embodiment is particularly suited to the detection of the presence of a particular substance in a sample (such as a suitcase or the like). The apparatus comprises in general terms a control computer 100, means 102 for applying one, or more usually several, continuous radio-frequency excitation pulses to the sample covering a selected excitation frequency range and for a given duration, means 104 for generating shaped pulses for passing to the applying means 102, means 106 for detecting the NQR response signal, and an audio or visual alarm 108 which alerts the operator to the presence of the substance under test. Although not illustrated, the apparatus would normally include some means, such as a conveyor, for transporting the sample relative to the apparatus, so that a series of samples can be tested "on the fly".

With the technique of the preferred embodiment, each individual excitation pulse is shaped such that phase varies during the pulse, and preferably over a substantial proportion of the duration of the pulse, say, over at least 50%, more preferably at least 75 or 90%, most preferably over the entirety of the pulse. The phase modulation is preferably continuous in time, the excitation pulse itself being continuous in time (that is, there is no period during the pulse when the excitation is off, although the excitation may instantaneously pass through zero).

In more detail concerning the preferred embodiment, the excitation pulse application means 102 includes a radio-frequency power amplifier 110 whose output is connected to an r.f. probe 112 which contains one or more r.f. coils disposed about the sample to be tested (not shown).

The r.f. probe 112 also forms part of the detecting means 106 which also includes r.f. receiver and detection circuitry 120.

The shaped pulse generating means 104 comprises a pulse programmer 130 for producing trigger signals to time the pulse, a spectrometer 132, manufactured by SMIS, United Kingdom, for generating a radio-frequency carrier signal at a known carrier reference frequency and fixed amplitude, the signal being gated by the trigger signals, a function generator 134, manufactured by Farnell, United Kingdom (Model No. SFG 25), for generating from a stored representation a waveform to modulate the amplitude of the carrier signal, the output of the function generator also being initiated by the trigger signals, and a double balanced mixer 136 for mixing the modulating waveform and the carrier signal and passing the mixed signal to the r.f. power amplifier 110. It will thus be appreciated that the shaped pulse generating means 104 is capable of applying to the sample a time-domain excitation waveform which is amplitude but not otherwise phase modulated.

The computer 100 ultimately controls all pulses, their radio-frequency, time, width, amplitude and phase. It is arranged to time the application of the excitation pulses substantially simultaneously with the arrival of a particular sample adjacent the probe 112. It also acts to receive the detected NQR response signal from the detecting means 106 and to process it, carry out signal addition or subtraction, and finally trigger the alarm 108 if appropriate.

As mentioned previously, the invention is based on the phase of the excitation varying generally non-linearly with excitation frequency. Thus the excitation can be represented as a complex function in the frequency domain (of the form $E(\omega) = E_{real}(\omega) + i \cdot E_{imaginary}(\omega)$). In general, the excitation will also be a complex function in the time domain (of the form $E(t) = E_{real}(t) + i \cdot E_{imaginary}(t)$). Hence a purely amplitude modulated time domain excitation waveform will in general not be adequate for the purposes of the present invention, so that the apparatus of FIG. 2 would generally be inappropriate. However, there are special cases for which this apparatus can be used.

Two such cases are now exemplified with reference to FIGS. 3 and 4 respectively. In both examples, the functions in the time domain had no fixed length, so that it was necessary to truncate them symmetrically at both ends where they tended to zero. The result of the truncation was to produce various artefacts in the frequency domain. These could be reduced (but not avoided) by using some form of apodisation if desired.

In the first example (FIG. 3), a rectangular shape was selected for the frequency domain excitation spectrum. The phase variation over the selected excitation frequency range was quadratic with respect to the frequency off-set ($\Delta\nu = \nu - \nu_0$), and anti-symmetric about the centre (carrier) frequency ($\nu_0$). That is, in the lower frequency half-range phase varied quadratically and was negative, at the centre frequency phase was zero, and in the upper frequency half-range phase varied quadratically and was positive.

The time domain waveform obtained by inverse Fourier transformation of this spectrum is shown in FIG. 3(*a*) (the real part of the waveform) and FIG. 3(*b*) (the imaginary part). The waveform was truncated to a duration of 1 ms. Note that in this example the imaginary part should have been zero in theory, and only appears because the centre of the spectrum was taken at point 512 of 1024 points instead of between 512 and 513.

It will be understood that in FIGS. 3(*a*) and 3(*b*) the radio-frequency carrier signal has been omitted for clarity. In fact, FIGS. 3(*a*) and 3(*b*) represent the modulating waveform (shaping function) which is mixed with the carrier signal. This convention is utilised from henceforth.

FIG. 3(*c*) shows the modulus of the Fourier transform of the waveform of FIGS. 3(*a*) and 3(*b*). The deviation from a pure rectangular shape is caused by the truncation of the waveform.

FIG. 3(*d*) is the same as FIG. 3(*c*), except that the imaginary part of the time domain waveform (see FIG. 3(*b*)) was set to zero. It can be seen that FIG. 3(*d*) does not differ excessively from FIG. 3(*c*). This is because the imaginary part of the waveform was in any case small. Hence it is acceptable to ignore the imaginary part of the waveform and utilise as the modulating waveform purely the real part shown in FIG. 3(*a*).

Thus in the first example, in practice only the waveform shown in FIG. 3(*a*) was utilised as the modulating waveform in the first embodiment of the apparatus (FIG. 2). This waveform amplitude modulates, but does not otherwise phase modulate, the carrier signal. It will of course be understood that even "pure" amplitude modulation (achieved, for example, by multiplication of two signals with each other) gives rise to a change of phase (between 0° and 180°).

FIG. 3(*e*) shows the result of an experiment with the explosive RDX as the substance of interest. The NQR testing apparatus was used to excite one of the $^{14}N$ $\nu_+$ resonances of RDX (the one near 5192 kHz having a free induction decay time, $T_2^*$, of roughly 1.4 ms at room temperature and a line width of about 200 Hz). The variation of the integrated area under the NQR signal detected by the detection means with respect to the carrier frequency of the spectrometer is presented. The circular data points represent an excitation pulse having a bandwidth (the selected excitation frequency range) of 20 kHz; the bandwidth for the square data points was 10 kHz.

It can be seen that the two sets of experimental data points agree well. For the 20 kHz bandwidth the peak power (P) for the pulse was 208 W for a $90°_{effective}$ pulse. This compares with a peak power of 2000 W for the corresponding rectangular excitation pulse of the same excitation bandwidth.

In the second example (FIG. 4), again a rectangular shape, symmetric with respect to the carrier frequency, was selected for the frequency domain excitation spectrum, but only the upper half of the desired rectangular spectrum was selected. The phase variation over the selected excitation frequency range was quadratic. The example relies on the fact that if a carrier frequency $\nu_o$ is multiplied (mixed, amplitude modulated) with a linear modulating signal $\nu_m$ the resultant is a pair of frequencies symmetric about the original carrier, with the carrier itself gone: $\nu_{1,2} = \nu_o \pm \nu_m$. Therefore if a complex waveform is derived which covers one half of the desired bandwidth on one side of the carrier frequency, and then only the real part of that waveform is taken, the complete bandwidth is covered. This is illustrated in FIG. 4.

FIG. 4(*a*) shows the modulus of the time domain waveform obtained by inverse Fourier transformation of the upper half-bandwidth. The dotted lines indicate where the waveform was truncated to create a 1ms pulse duration. FIG. 4(*b*) shows the truncated real part of this waveform. This real part is the modulating waveform which was used to modulate the carrier signal. FIG. 4(*c*) shows the real part of the Fourier transform of the truncated waveform of FIG. 4(*b*), whilst FIG. 4(*d*) shows the modulus of this transformation. The deviation from a rectangular shape is again due only to the truncation. In FIG. 4(*d*) the carrier frequency is shown as a dotted line. It is clear from FIG. 4(*d*) that there is excitation of both sides of the carrier frequency.

FIG. 4(*e*) shows the result of a similar experiment to that described in relation to FIG. 3(*e*), but using the modulating waveform of FIG. 4(*b*) rather than that of FIG. 3(*a*). The bandwidth of the excitation pulse was 20 kHz. The plot in FIG. 4(*e*) matches closely that in FIG. 3(*e*). The peak power (P) for the pulse was 133 W for a $90°_{effective}$ pulse.

FIG. 4(*f*) is a similar plot to that shown in FIG. 4(*e*), except that it was derived using a modulating waveform obtained by inverse Fourier transformation of the lower half-bandwidth. This modulating waveform is in fact the time reversal of that shown in FIG. 4(*b*). FIGS. 4(*e*) and 4(*f*) differ only in that the former shows a peak in the NQR signal near 5192 kHz, whilst the latter shows a trough in the same region. If the NQR response signal were to follow the excitation closely, the region would be expected to be nearly flat (as shown in FIG. 4(*d*)).

The explanation for this difference is as follows. For the experiment of FIG. 4(*e*) frequencies far from the carrier frequency were applied at the beginning of the pulse, whereas frequencies near the carrier frequency were applied at the end, as can be seen in FIG. 4(*b*). Thus different NQR resonances were excited at different instants. The free induction decay time $T_2^*$ of 1.4 ms for the particular resonance frequency of RDX under test is not much greater than the pulse length of 1 ms. Therefore the resonances far from the centre frequency excited at the start of the pulse have already partly decayed during the pulse and are hence weaker by the time detection takes place after the end of the pulse than those closer to the centre excited only at the end of the pulse. In FIG. 4(*f*) the reverse is true, as a time reversed function was used, which explains the reversal of the peak of FIG. 4(*e*).

Hence it is important when carrying out NQR tests using the present invention that the pulse duration is carefully controlled in relation to the $T_2^*$ of the substance being tested, in order to prevent unacceptable loss of NQR response signal before detection. Hence the pulse duration is preferably less than twice $T_2^*$, more preferably only 100%, 75% or even 50% of $T_2^*$. In the present case it is 1 ms/1.4 ms=70%.

One way of maximising the pulse duration with respect to $T_2^*$ would be to arrange for the NQR testing apparatus to generate a given number of pulses of the type described in relation to FIG. 4(*e*), followed by an equal number of pulses of the type described in relation to FIG. 4(*f*), or vice versa. Addition of the two sets of responses would then yield a substantially flat response over the excitation bandwidth. This technique may be important when testing the explosives TNT and PETN, since $T_2^*$ is expected to be shorter for such explosives than it is for RDX.

The particular $v_+$ line of RDX mentioned above as having a $T_2^*$ of roughly 1.4 ms is an especially advantageous line to investigate. The other $v_+$ lines have $T_2^*$'s of less than 1 ms, and hence would necessitate the use of a shorter pulse. This would have the disadvantage of raising the excitation pulse peak power.

A variant of the preferred embodiment of NQR testing apparatus is now described with reference to FIG. 5. Only the shaped pulse generating means 204 is illustrated; the remaining components are identical to those of the embodiment described with reference to FIG. 2. In broad terms, the generating means 204 of the variant is similar to the generating means 104, except that it is a double channel rather than a single channel arrangement. Hence it can produce a waveform which is phase as well as amplitude modulated.

The variant again includes a pulse programmer 230 and spectrometer 232. However, two function generators 234*a* and 234*b*, and two double balanced mixers 236 are provided. In addition, a quadrature hybrid 0°–90° splitter 238, a combiner 240 and resistors 242 and 244 are provided. In this embodiment, the splitter 238 is a 5 MHz splitter made by Mini Circuits (U.S.A.) and bearing Model Number PSCQ 2-5-1; the combiner 240 and mixers 236 are both made by Hatfield (U.K.) and bear the Model Numbers DP102 and MC 291 respectively. The resistors 242 are 56Ω whilst resistors 244 are 560Ω. The whole network of resistors 242 together with resistors 244 results in a resistance of 50Ω seen by function generators 234.

The variant functions as follows. Spectrometer 232 is gated and the outputs of the function generators 234 are initiated by the pulse programmer 230 as described in relation to the first embodiment. The splitter 238 produces from the radio-frequency carrier signal two radio frequency signals in relative quadrature. The function generators 234*a* and 234*b* generate the real and imaginary parts respectively of the modulating waveform. The resistors 242 provide impedance matching with the cables from the function generators, whilst the resistors 244 convert the voltage output of the function generators to a current output for passing to the mixers 236. After mixing of the relevant modulating waveforms and carrier signals in the mixers 236, the two resultant waveforms are combined in the combiner 240 to form an amplitude and phase modulated signal for passing to the radio-frequency power amplifier 110.

In a modification of the variant, a single function generator could be provided. The output of the generator would be passed through a further quadrature hybrid, the two outputs of which would be passed to the respective mixers 236. This modification would produce the type of modulation known in the field of telecommunications as single side-band modulation with suppressed carrier. The modification has the possible disadvantage that the quadrature hybrid would work at very low frequencies.

A third example of the use of the present invention is now described in relation to FIG. 6. The variant of the apparatus described with reference to FIG. 5 was used, with the excitation spectrum nominally rectangular and a quadratic phase variation. In FIG. 6(*a*) the truncated modulus of the modulating waveform derived by inverse Fourier transformation of the desired rectangular frequency domain excitation spectrum is shown. The real and imaginary parts of this waveform are shown respectively in FIGS. 6(*b*) and 6(*c*). The modulus of the Fourier transform of this waveform is shown in FIG. 6(*d*), whilst the real part of this spectrum is shown in FIG. 6(*e*). The waveform shown in FIG. 6(*d*) is not perfectly rectangular because the waveform of FIG. 6(*a*) has been truncated. Finally, in FIG. 6(*f*) an oscillogram of the time domain excitation pulse is shown. This shows the effects of the modulating waveform on the radio frequency carrier signal.

The peak power of the pulse was 1.44 W. The peak magnetic field ($B_{rf}$) for the excitation pulse was no greater than 0.16 mT at a flip angle of $30°_{effective}$ and for a 15 kHz excitation bandwidth. These are the lowest values of peak power and $B_{rf}$ of any of the examples. These low values were achieved mainly because neither envelope of the time domain excitation waveform had any zero crossing (compare FIG. 6(*a*) with, for example, FIG. 3(*a*)), but rather each envelope was relatively flat, so that power was distributed as evenly as possible throughout the duration of the excitation.

In a fourth example of NQR test, it was found that echo responses could be generated from the NQR resonance of RDX at 5.19 MHz using shaped pulses of the type described above. For the experiment, a pair of $90°_{effective}$ shaped pulses was used. (It will be noted that flip angle needs to be close to $90°_{effective}$ or higher for echoes to be generated.) Aside from the greater flip angle, the individual pulses were identical to those described in relation to the third example. In particular, a quadratic phase variation was employed. The echo signal amplitude was found to be similar to that obtained using a pair of rectangular $90°_{eff}$ pulses. The value of $B_{rf}$ in this fourth example was 0.47 mT.

It is to be noted that, in any of the embodiments or examples described above, it should be possible to reverse the phase distortion in the final spectrum of the excitation by data manipulation based on the known desired phase dependence with frequency. The absorption mode signal can then be used, rather than the modulus, for detection purposes.

It has been found that the shaped pulses described herein may be most satisfactorily employed in experiments with substances having signals exhibiting relatively small line widths. A small line width is preferable because it enables the excitation of large frequency ranges with low $B_{rf}$ field and low power. If only relatively broad lines are available, higher power may need to be used. For RDX, a good line is that at 5190 kHz, which has a line width of only about 200 Hz at room temperature.

It will of course be understood that the present invention has been described above purely by way of example, and modifications of detail can be made within the scope of the invention.

We claim:

1. Apparatus for Nuclear Quadrupole Resonance (NQR) testing a sample, comprising:

means for applying excitation to the sample;

means for detecting the response signal; and control means adapted to control the excitation applying means to apply excitation to the sample to excite NQR resonance, the excitation comprising at least one excitation pulse, each excitation pulse covering a selected excitation frequency range, the phase of each excitation pulse varying generally non-linearly with the excitation frequency over the selected range, the control means further being adapted to control the detecting means to detect the NQR response signal.

2. Apparatus according to claim 1 wherein for the duration of the excitation an envelope of the time domain excitation waveform has no zero crossing.

3. Apparatus according to claim 1 wherein the excitation applying means is adapted to apply excitation the time domain waveform of which is both amplitude and phase modulated.

4. Apparatus according to claim 3 wherein the applying means includes means for producing two signals which are in relative quadrature, and means for combining the signals toform the amplitude and phase modulated excitation.

5. Apparatus according to claim 1 wherein the applying means is adapted to apply excitation the time domain waveform of which is amplitude modulated but not otherwise phase modulated.

6. Apparatus according to claim 1 wherein the applying means is adapted to apply excitation the time domain waveform of which is modulated according to a chirp function.

7. Apparatus according to claim 1 wherein the excitation applying means includes means for generating a carrier signal and means for modulating the carrier signal to produce excitation the phase of which varies generally non-linearly with the excitation frequency over the selected range.

8. Apparatus according to claim 7 wherein the modulating means includes means for storing a representation of a modulating waveform for modulating the carrier signal.

9. Apparatus according to claim 1 wherein the phase of the excitation varies generally quadratically with a frequency off-set.

10. Apparatus according to claim 1 wherein the excitation applying means is adapted to apply a plurality of excitation pulses, in such a way as to generate at least one echo response signal.

11. Apparatus according to claim 1 wherein the modulus of the frequency domain excitation spectrum is substantially constant over the selected excitation frequency range.

12. Apparatus according to claim 1, being for the detection of the presence of a given NQR substance in the sample, including an alarm for indicating the presence of the substance.

13. A method of Nuclear Quadrupole Resonance (NQR) testing a sample, comprising:

applying excitation to the sample to excite NQR resonance, the excitation comprising at least one excitation pulse, each excitation pulse covering a selected excitation frequency range, the phase of each excitation pulse varying generally non-linearly with the excitation frequency over the selected range;

and detecting the NQR response signal.

14. A method according to claim 13 wherein for the duration of the excitation an envelope of the time domain excitation waveform has no zero crossing.

15. A method according to claim 13 wherein the time domain waveform of the excitation is both phase and amplitude modulated.

16. A method according to claim 13 wherein the time domain waveform of the excitation is amplitude modulated but not otherwise phase modulated.

17. A method according to claim 13 wherein the time domain waveform of the excitation is modulated according to a chirp function.

18. A method according to claim 13 wherein the variation of the phase of the excitation with the excitation frequency is symmetric.

19. A method according to claim 13 wherein the variation of the phase of the excitation with the excitation frequency is antisymmetric.

20. A method according to claim 13 wherein the phase of the excitation varies generally quadratically with a frequency off-set.

21. A method according to claim 13 wherein a plurality of excitation pulses are applied, in such a way as to generate at least one echo response signal.

22. A method according to claim 13 wherein a selected NQR resonance is excited with at least one excitation pulse, and the duration of the excitation pulse is less than twice the free induction decay time, $T_2^*$, appropriate to that resonance.

23. A method according to claim 22 wherein the duration is less than 100% of $T_2^*$.

24. A method according to claim 13, being for the detection of the presence of a given NQR substance in the sample.

25. A method according to claim 24 wherein the presence of the substance is indicated by an alarm.

26. A method according to claim 13 wherein the sample comprises a polycrystalline substance.

27. A method of extending the Nuclear Quadrupole Resonance (NQR) free induction decay time, $T_2^*$, of a sample containing quadrupolar nuclei, comprising applying excitation to the sample over a selected excitation frequency range to excite NQR resonance, the phase of the excitation varying generally non-linearly with the excitation frequency over the selected range.

* * * * *